(12) United States Patent
Hwang et al.

(10) Patent No.: US 10,269,582 B2
(45) Date of Patent: Apr. 23, 2019

(54) PACKAGE STRUCTURE, FAN-OUT PACKAGE STRUCTURE AND METHOD OF THE SAME

(71) Applicant: TAIWAN SEMICONDUCTOR MANUFACTURING COMPANY LTD., Hsinchu (TW)

(72) Inventors: Chien Ling Hwang, Hsinchu (TW);
Hsin-Hung Liao, Taipei (TW);
Yu-Ting Chiu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/861,486

(22) Filed: Jan. 3, 2018

(65) Prior Publication Data

US 2018/0130673 A1    May 10, 2018

Related U.S. Application Data

(62) Division of application No. 14/882,887, filed on Oct. 14, 2015, now Pat. No. 9,870,929.

(51) Int. Cl.
| | | |
|---|---|---|
| *H01L 21/48* | (2006.01) | |
| *H01L 21/56* | (2006.01) | |
| *H01L 23/00* | (2006.01) | |
| *H01L 23/31* | (2006.01) | |
| *H01L 21/683* | (2006.01) | |

(Continued)

(52) U.S. Cl.
CPC ........ *H01L 21/4814* (2013.01); *H01L 21/565* (2013.01); *H01L 21/568* (2013.01); *H01L 21/6835* (2013.01); *H01L 23/3142* (2013.01); *H01L 23/49822* (2013.01); *H01L 23/5388* (2013.01); *H01L 24/17* (2013.01); *H01L 23/49816* (2013.01); *H01L 2224/16055* (2013.01); *H01L 2224/16057* (2013.01);

(Continued)

(58) Field of Classification Search
CPC ........... H01L 23/5227; H01L 23/53228; H01L 21/4814; H01L 23/3142; H01L 21/568; H01L 24/17; H01L 21/565; H01L 21/21; H01L 21/6835; H01L 2224/16245; H01L 2924/19042; H01L 2224/16055; H01L 2224/16265; H01L 2224/16057
See application file for complete search history.

(56) References Cited

U.S. PATENT DOCUMENTS

| | | | |
|---|---|---|---|
| 9,269,643 B2 * | 2/2016 | Liao | ..................... H01L 23/3114 |
| 10,008,479 B2 * | 6/2018 | Hsiao | ..................... H01L 24/24 |

(Continued)

*Primary Examiner* — Victor A Mandala
(74) *Attorney, Agent, or Firm* — WPAT, P.C., Intellectual Property Attorneys; Anthony King

(57) ABSTRACT

A package structure includes a spiral coil, a redistribution layer (RDL) and a molding material. The molding material fills gaps of the spiral coil. The spiral coil is connected to the RDL. A fan-out package structure includes a spiral coil, an RDL and a die. The spiral coil has a depth-to-width ratio greater than about 2. The RDL is connected to the spiral coil. The die is coupled to the spiral coil through the RDL. A semiconductor packaging method includes: providing a carrier; adhering a spiral coil on the carrier; adhering a die on the carrier; dispensing a molding material on the carrier to fill gaps between the spiral coil and the die; and disposing a redistribution layer (RDL) over the carrier so as to connect the spiral coil with the die.

20 Claims, 16 Drawing Sheets

(51) Int. Cl.
*H01L 23/538* (2006.01)
*H01L 23/498* (2006.01)

(52) U.S. Cl.
CPC ............ *H01L 2224/16245* (2013.01); *H01L 2224/16265* (2013.01); *H01L 2924/19042* (2013.01)

(56) References Cited

U.S. PATENT DOCUMENTS

| | | | |
|---|---|---|---|
| 10,049,808 B2 * | 8/2018 | Ahn | H01F 27/29 |
| 2008/0157217 A1 * | 7/2008 | Burke | H01L 21/76801 |
| | | | 257/379 |
| 2011/0042782 A1 * | 2/2011 | Chao | H01L 28/10 |
| | | | 257/531 |
| 2011/0073987 A1 * | 3/2011 | Mackh | H01L 21/76898 |
| | | | 257/531 |
| 2012/0187530 A1 * | 7/2012 | Zhang | H01L 23/645 |
| | | | 257/531 |
| 2014/0097514 A1 * | 4/2014 | Elian | H01L 23/5389 |
| | | | 257/531 |
| 2014/0312458 A1 * | 10/2014 | Ashrafzadeh | H01L 23/3121 |
| | | | 257/531 |
| 2015/0282308 A1 * | 10/2015 | Meyer | H01L 25/105 |
| | | | 361/729 |
| 2016/0035670 A1 * | 2/2016 | Chen | H01L 25/105 |
| | | | 257/531 |
| 2016/0181211 A1 * | 6/2016 | Kamgaing | H01L 23/66 |
| | | | 257/621 |
| 2016/0276269 A1 * | 9/2016 | Peng | H01L 23/5227 |

* cited by examiner

PACKAGE STRUCTURE, FAN-OUT PACKAGE STRUCTURE AND METHOD OF THE SAME

PRIORITY CLAIM AND CROSS-REFERENCE

This application is a division of application Ser. No. 14/882,887, filed on Oct. 14, 2015, and claims priority thereto.

BACKGROUND

A patterned thin film formed by frame plating may be utilized in spiral coil. In such applications a patterned thin film that is small in width and great in thickness may be required in some cases. Consideration will now be given to a case in which frame plating is utilized to form the above-mentioned patterned thin film that is small in width and great in thickness. If a single-layer frame is used to form the patterned thin film in this case, it is required to make a frame that has a great thickness and a groove with a reduced width. However, it is difficult to make such a frame with accuracy.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
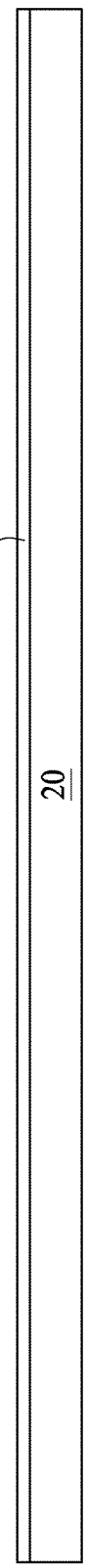
FIGS. 1 through 6 are schematic views and cross sectional views illustrating intermediate stages in the manufacturing of a fan-out structure including a spiral coil in accordance with some exemplary embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A fan-out package structure having at least one spiral coil included and the methods of forming the same are provided in accordance with various exemplary embodiments. The intermediate stages of forming the fan-out package structure are illustrated. The variations of the embodiments are discussed. Throughout the various views and illustrative embodiments, like reference numbers are used to designate like elements.

FIGS. 1 through 6 are schematic views illustrating intermediate stages in the manufacturing of a fan-out structure including a spiral coil in accordance with some exemplary embodiments of the present disclosure. FIG. 1 is a cross-sectional view illustrating a carrier 20, and an adhesive layer 22 on the carrier 20. The carrier 20 may be a glass carrier, a ceramic carrier, or the like. The adhesive layer 22 may be formed of an adhesive such as an adhesive film.

Figure 2A:
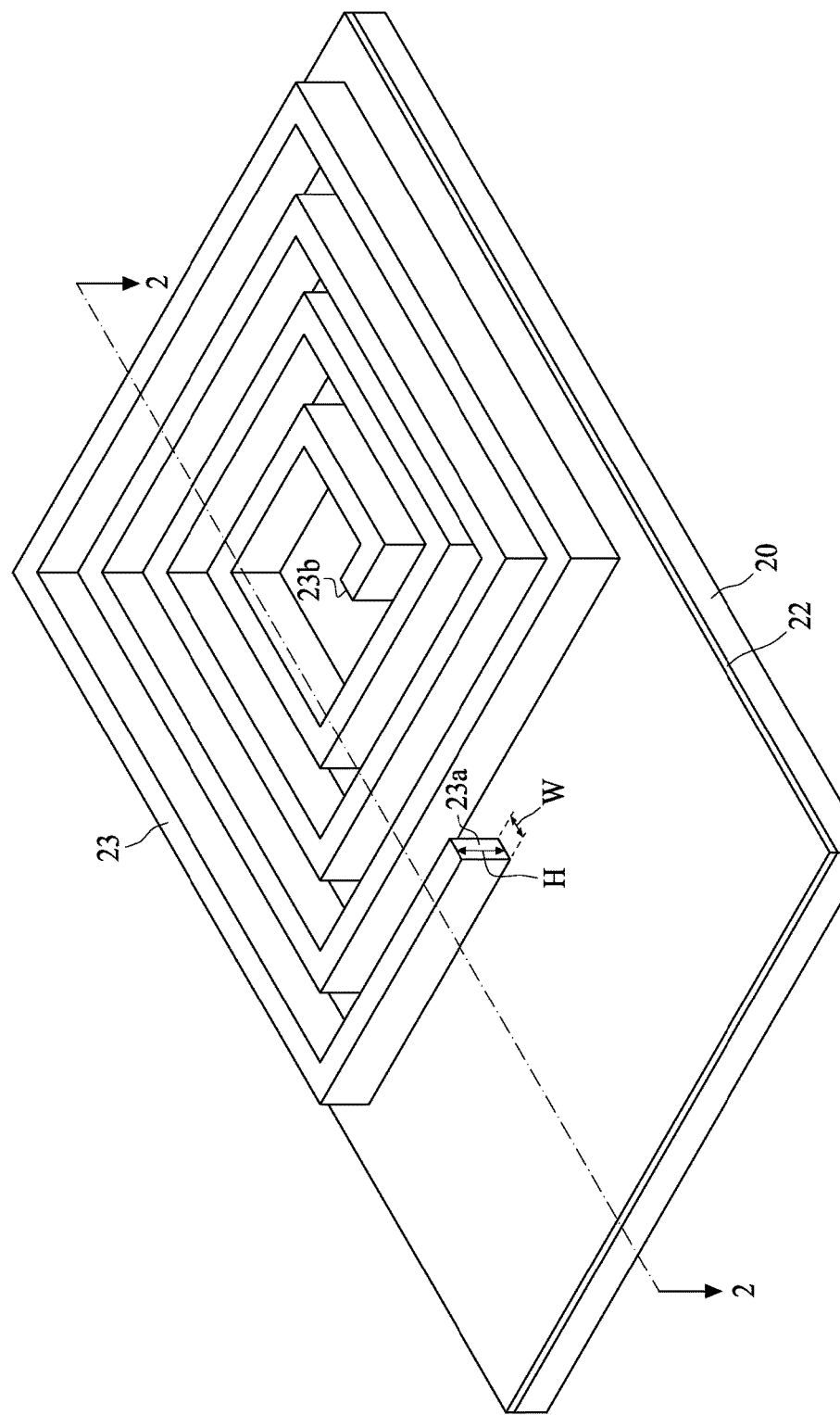

FIG. 2A is a three-dimensional perspective view illustrating the placement of a spiral coil 23 over the carrier 20. The spiral coil 23 is a planar spiral coil inductor with 4 turns and has a basic profile of a polygon when seen from a top view perspective. In this embodiment, the spiral coil 23 outlines a quadrilateral shape from a top view perspective. In some embodiments, the spiral coil 23 may be arranged in a foursquare shape, an equilateral polygon shape, a circular shape or an oval shape from a top view perspective. In some embodiments, the spiral coil 23 may have rounded corners. The spiral coil 23 has a polygon, circular or oval cross-section, and the cross-section has a dimension height H and width W as shown in FIG. 2A. Please note that it is not intended for the invention to be limited to the geometry examples shown herein. The spiral coil 23 includes a first end 23a at the outermost coil turn and a second end 23b at the innermost coil turn.

Figure 2B:
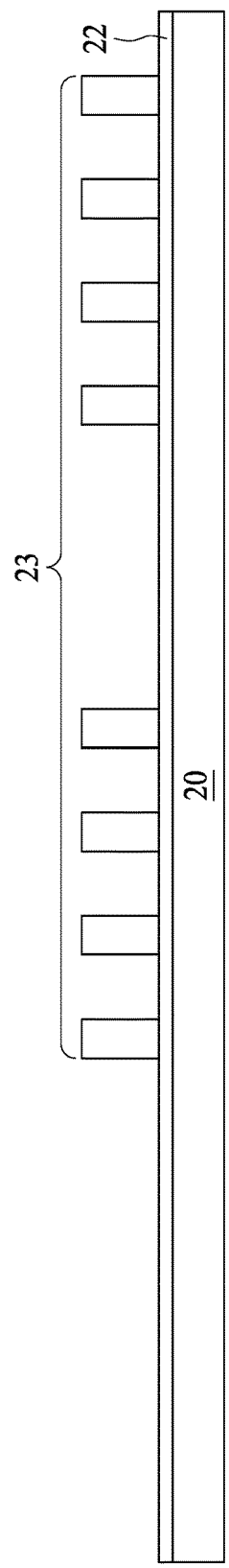

The spiral coil 23 is a component fabricated elsewhere and subsequently being placed on the carrier 20. In some embodiments, the spiral coil 23 may be comprised of copper (Cu) and fabricated by operations such as low-cost punching, wet etching or laser-cutting. The spiral coil 23 made by said operations has an increased thickness (i.e. H) and thus a greater depth-to-width ratio (i.e. the ratio of H and W, also called aspect ratio) comparing to existing spiral coil prepared by plating methods that electroplates a coil on a patterned substrate. Under a fixed width, a greater depth provides a larger cross-sectional area for the spiral coil 23 thus increasing the entire inductance. In some embodiments, the depth-to-width ratio may exceed 2. FIG. 2B is a cross-sectional view illustrating the placement of the spiral coil 23 over the carrier 20 taken along the lines 2-2 of FIG. 2A.

In some embodiments, a pick and place machine may be employed to mount the planar spiral coil 23 onto a wafer one by one. The pick and place machine may include a vacuum nozzle with a plurality of holes thereon to provide a vacuum suction force in order to securely hold the planar spiral coil 23 when moving the planar spiral coil 23 from a tray to a specified position on the wafer. In some other embodiments, a vibration parts alignment apparatus may be employed to mount a group of the planar spiral coils 23 onto a wafer at one time, as opposed to the aforesaid pick and place operations. The vibration parts alignment apparatus may include a coils alignment pallet fixedly supported by a vibration generator, wherein the coils alignment pallet has a plurality of recesses for alignment of the group of planar spiral coils 23 during vibration of the vibration generator. Thereafter, the wafer is flipped and attached to the coils alignment pallet so that the group of planar spiral coils 23 can be transferred from the pallet to the wafer through a press and heating operation.

Figure 3A:
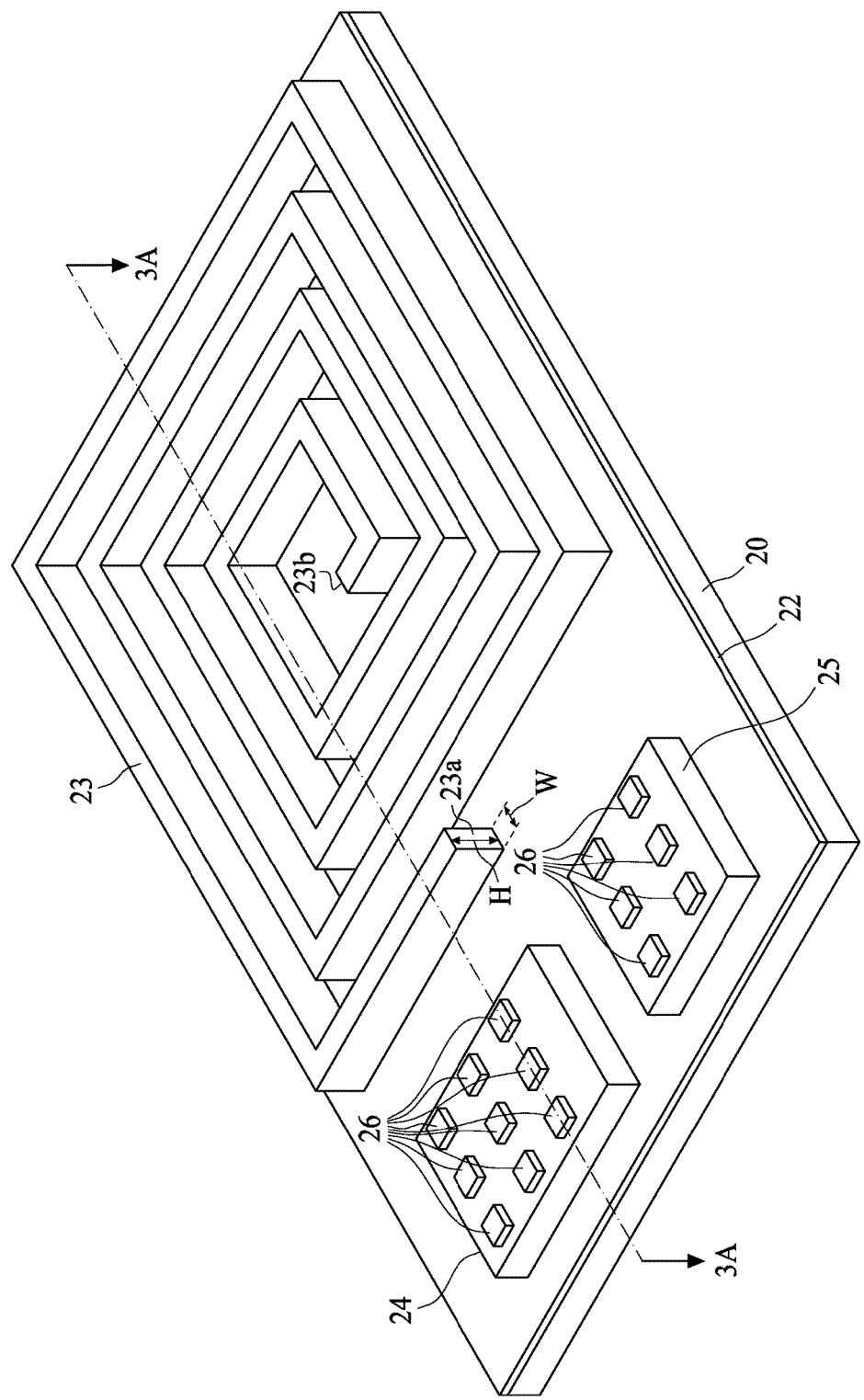

FIG. 3A is a three-dimensional perspective view illustrating the placement of dies 24 and 25 over the carrier 20. The die 24 and die 25 are placed over the carrier 20 by the side of the spiral coil 23. In some embodiments, the die 24 and die 25 are attached to the adhesive layer 22, which is adhered to the carrier 20. The die 24 may be a logic device die including logic transistors therein. The die 25 may include integrated passive devices (IPD) such as resistors, capacitors and inductors.

Electrical connectors 26 are formed as the top portions of the die 24 and die 25, and are electrically coupled to the devices in the die 24 and the IPD in the die 25. In some embodiments, the electrical connectors 26 include metal pillars (such as copper pillars), which may be pre-formed before the device die 24 and die 25 are placed over the carrier 20. The metal pillars 26 may be solder-free, and may comprise vertical sidewalls. In some embodiments, dielectric layers are formed at the top surfaces of the die 24 and die 25, with metal pillars 26 having at least lower portions, or entireties, in the dielectric layer. The top surfaces of the dielectric layers may also be substantially level with the top ends of the metal pillars 26. The dielectric layers may be comprised of polyimide, polybenzoxazole (PBO), an oxide layer, a nitride layer, or multi-layers thereof. When the dielectric layers are not formed, the metal pillars 26 protrude above the top surfaces of the die 24 and die 25. In this embodiment, the dielectric layers are not depicted in the FIG. 3A and subsequent drawings.

Figure 3B:
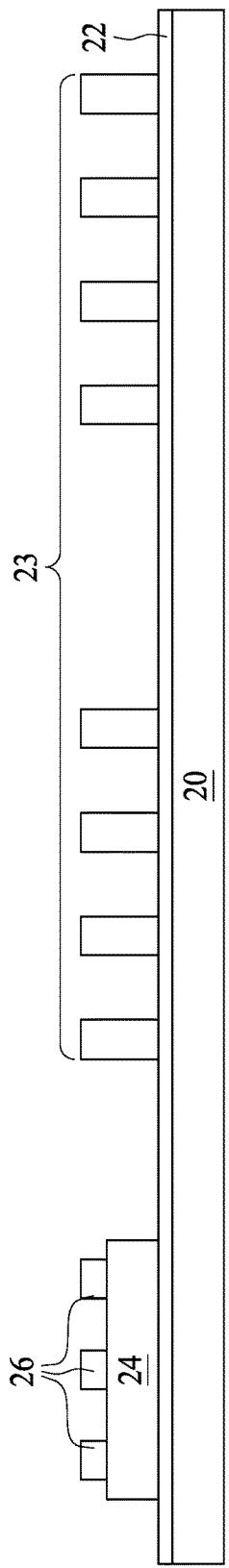

FIG. 3B is a cross-sectional view illustrating the placement of the dies 24 and 25 over the carrier 20 taken along the lines 3A-3A of FIG. 3A. The dies 24 and 25 are attached to the adhesive layer 22, which is adhered to the carrier 20. The thicknesses of the dies 24, 25 and the heights of metal pillars 26 are controlled so that the top ends of the metal pillars 26 of the dies 24 and 25 are substantially level with the a height of the spiral coil 23. Furthermore, since the dies 24, 25 and the spiral coil 23 are placed on the adhesive 22, the back surfaces of the dies 24, 25 and the spiral coil 23 are level with each other.

Figure 3C:
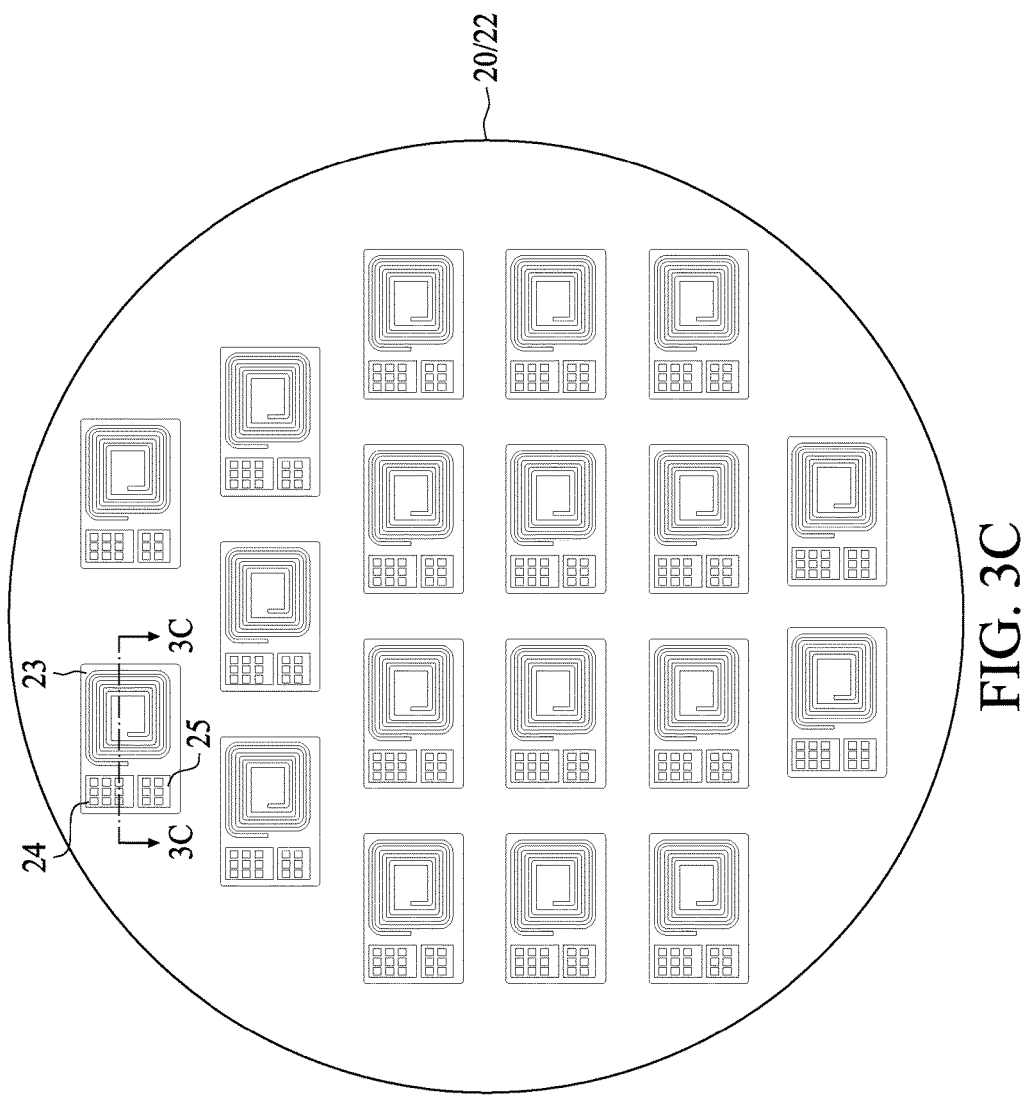

FIG. 3C illustrates a top view of the structure in FIGS. 3A and 3B. The cross-sectional view in FIG. 3B is obtained from a plane crossing line 3C-3C in FIG. 3C. In some embodiments, the placement of the dies 24, 25 and the spiral coil 23 is at a wafer level, and hence there are a plurality of dies 24, 25 and spiral coil 23 placed over the carrier 20. FIG. 3C illustrates that the carrier 20 has a round top-view shape. In alternative embodiments, the carrier 20 may also have a rectangular top-view shape, and the die 24 and die 25 may be laid out as an array. In FIG. 3C, the rectangles (not marked) encircling each groups of the dies 24, 25 and the spiral coil 23 define boundaries of the respective packages formed in subsequent steps.

Figure 4:
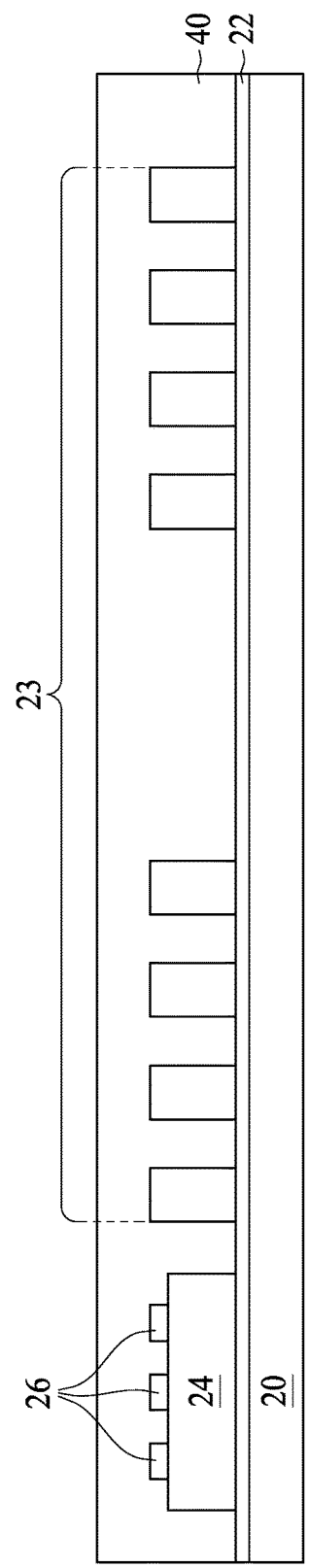

Referring to FIG. 4, a molding material 40 is dispensed and molded on the dies 24, 25 and the spiral coil 23. The molding material 40 fills the gaps between the dies 24, 25 and the spiral coil 23, and may be in contact with the adhesive layer 22. Furthermore, the molding material 40 may be filled into the gaps between the metal pillars 26 if the dielectric layers are not formed on the top surface of the dies 24 and 25. The molding material 40 is comprised of a polymer in some embodiments. For example, the molding material 40 may include a molding compound, a molding underfill, an epoxy, or a resin. A top surface of the molding material 40 is higher than the top ends of the metal pillars 26 and the spiral coil 23. The bottom surface of the molding material 40 is substantially level with the back surfaces of the dies 24, 25 and the spiral coil 23. After being dispensed, the molding material 40 is cured.

Figure 5:
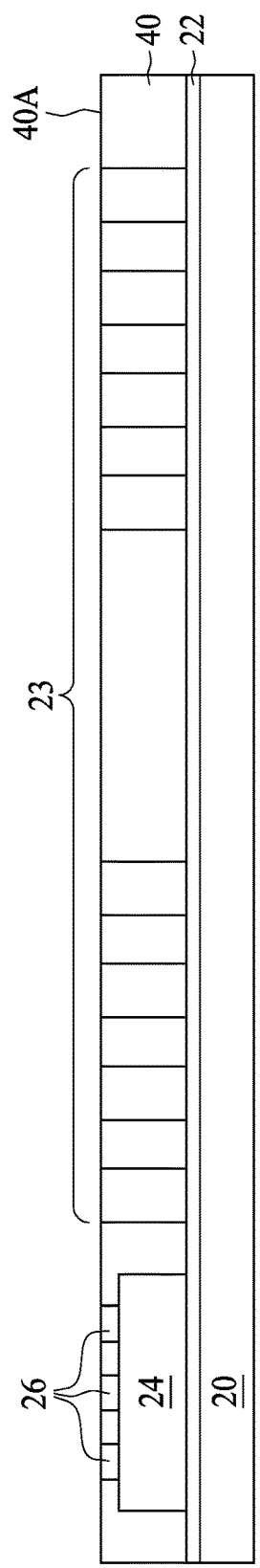

Next, a planarization step, which may be a grinding step or a Chemical Mechanical Polish (CMP) operation, is performed to thin the molding material 40. The planarization step may be completed until the top ends of the metal pillars 26 and the spiral coil 23 are exposed. The resulting structure is shown in FIG. 5. The top ends of the spiral coil 23 and the metal pillars 26 in the die 24 and die 25 are level with each other, and are level with a top surface 40A of the molding material 40. In some embodiments in which no dielectric layer is formed, the molding material 40 encircles, and is in contact with, each of the metal pillars 26. In alternative embodiments in which the dielectric layers are formed, the top ends of the metal pillars 26 are level with each other, and are substantially level with the surfaces of the dielectric layers and the top surface 40A of the molding material 40.

Figure 6:
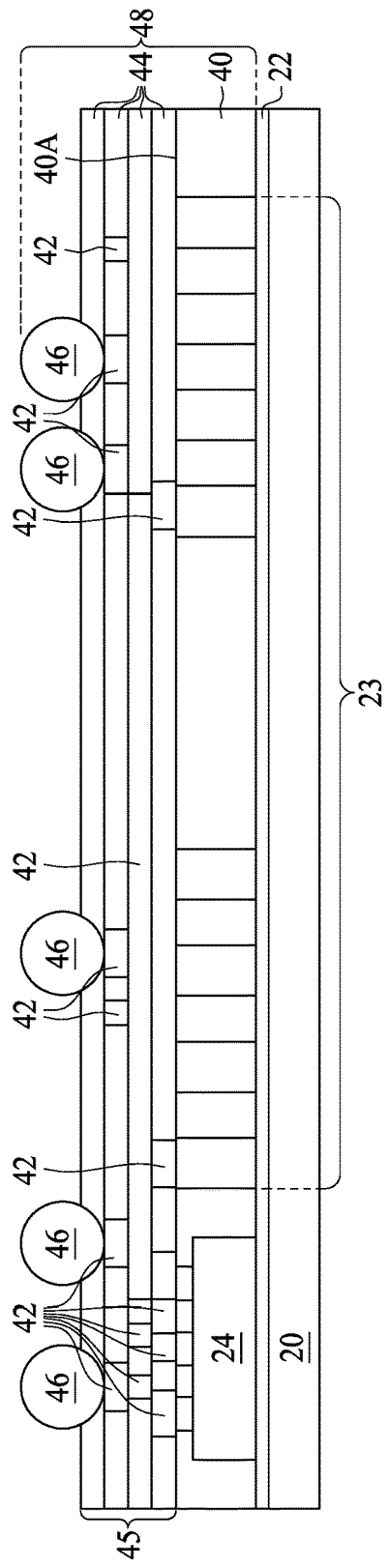

Next, referring to FIG. 6, a redistribution layer (RDL) 45 is formed over the molding material 40. The RDL 45 includes dielectric layers 44 and a plurality of connection patterns 42 reside therein. At least a portion of the connection patterns 42 is electrically connected to, and may interconnect, the metal pillars 26 and the spiral coil 23. There may be one, two, three, or more dielectric layers 44, each including a plurality of connection patterns 42 at the same level. The connection patterns 42 further include vias that interconnect the connection patterns in neighboring redistribution layers so as to connect the first end 23a and the second end 23b of the spiral coil 23 with the die 24 and/or die 25. The connection patterns 42 in the bottom redistribution layer and the respective dielectric layer 44 have a bottom surface in contact with the top ends of the metal pillars 26, the spiral coil 23 and the top surface 40A of the molding material 40. In some embodiments, the RDL 45 are formed by forming and patterning the dielectric layers 44, and forming the connection patterns 42 in the openings in the patterned dielectric layers 44. In alternative embodiments, the RDL 45 is formed by depositing metal layers, patterning the metal layers, and filling the gaps between the connection patterns 42 with the dielectric layers 44. In yet alternative embodiments, the RDL 45 may be formed using damascene processes. The RDL 45 may be comprised of copper, nickel, palladium, aluminum, tungsten, or the like. The dielectric layers 44 may comprise photo-sensitive materials such as polyimide, PBO, or the like, which may be patterned without using additional photo resists. The dielectric layers 44 may also be formed of a non-organic material or materials such as oxides and/or nitrides.

FIG. 6 also illustrates the formation of electrical connectors 46 in accordance with some exemplary embodiments. The formation of the connectors 46 may include placing solder balls on exposed portions of the connection patterns 42, and reflowing the solder balls. In alternative embodiments, the formation of the connectors 46 includes performing a plating step to form copper or solder regions over the exposed portions of the connection patterns 42. The connectors 46 may also include metal pillars, or metal pillars and solder caps, which may also be formed through plating. In some embodiments, the combined structure including the dies 24, 25 the spiral coil 23, the molding material 40, the overlying RDL 45 and the connectors 46 is referred to as a fan-out package 48. The carrier 20 is detached from the package 48 and the adhesive layer 22 may be removed in the subsequent operations. The fan-out package 48 occupies a portion of a wafer that includes a plurality of fan-out packages, and the wafer is die-sawed along scribe lines into a plurality of fan-out packages.

The exemplary embodiment described above provides a fan-out package including dies and a spiral coil integrated therein. In some embodiments, the dies and spiral coil may form a system for a specified wireless application, for example, a Radio-frequency identification (RFID) chip or a wireless charging chip. The spiral coil integrated in the fan-out package discussed herein possesses a higher depth-to-width ratio comparing to existing counterparts prepared by electroplating so that when providing the same performance, a form factor of the spiral coil of the present disclosure is smaller. In addition, the spiral coil of the present disclosure has a higher copper purity and a lower residual stress comparing to the existing counterparts.

In order to further enlarge an inductance to meet requirements of some wireless applications, two or more spiral coils may be integrated in a fan-out package. For example, an upper level spiral coil may fully or partially overlap with a lower level spiral coil to increase inductance.

Figure 7:
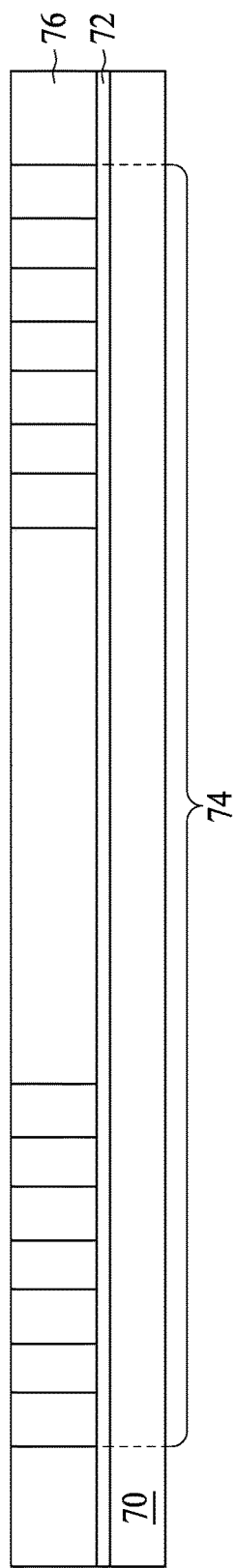
FIGS. 7 through 12 are cross sectional views and top views illustrating intermediate stages in the manufacturing of a fan-out structure including two level spiral coils in accordance with some exemplary embodiments of the present disclosure.

FIGS. 7 through 12 are schematic views illustrating intermediate stages in the manufacturing of a fan-out structure including two level spiral coils in accordance with some exemplary embodiments of the present disclosure. FIG. 7 is a cross-sectional view illustrating a carrier 70, an adhesive layer 72, a first spiral coil 74 and a molding material 76. The structure shown in FIG. 7 is similar to that in FIG. 5 except there is no die placed over the carrier 70. The first spiral coil 74 is substantially the same or similar to the first spiral coil 74 shown in FIGS. 1 through 6. Thus details regarding FIG. 7 are not repeated here for brevity.

Figure 8:
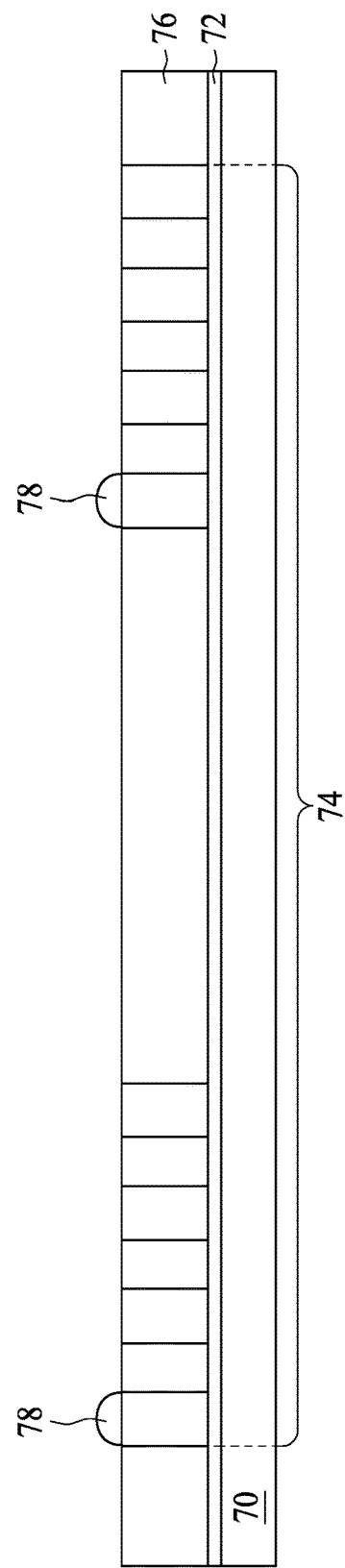
Figure 9:
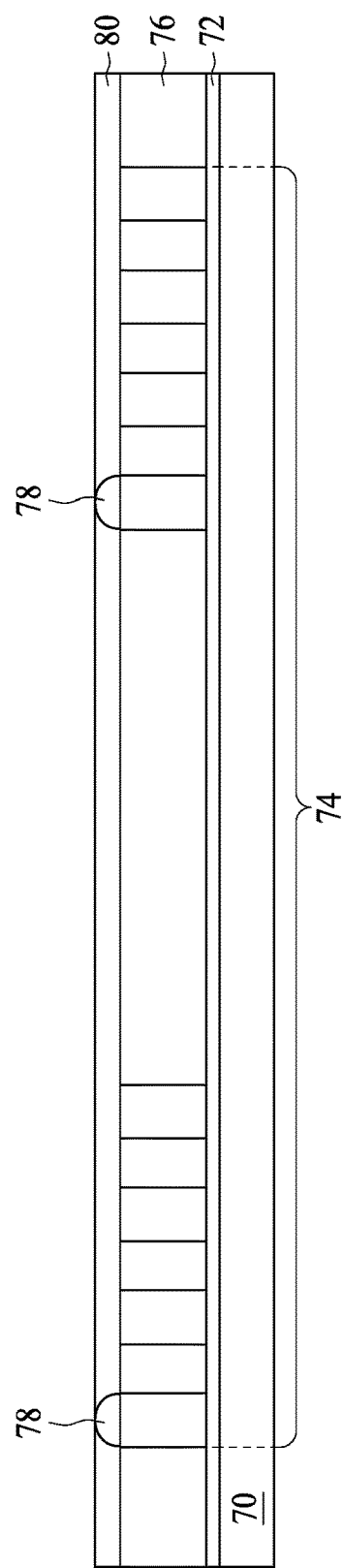

FIG. 8 illustrates the formation of contacts 78 in accordance with some exemplary embodiments. The formation of the contacts 78 may include placing solder balls or printing solder pastes on certain exposed portions of the first spiral coil 74, and reflowing the solder balls or solder pastes. FIG. 9 illustrates the formation of non-conductive film (NCF) in accordance with some exemplary embodiments. The NCF 80 is attached to the grinded surface of the molding material 76 and the first spiral coil 74 and to cover the contacts 78. The NCF 80 is formed of epoxy resin, for example.

Figure 10:
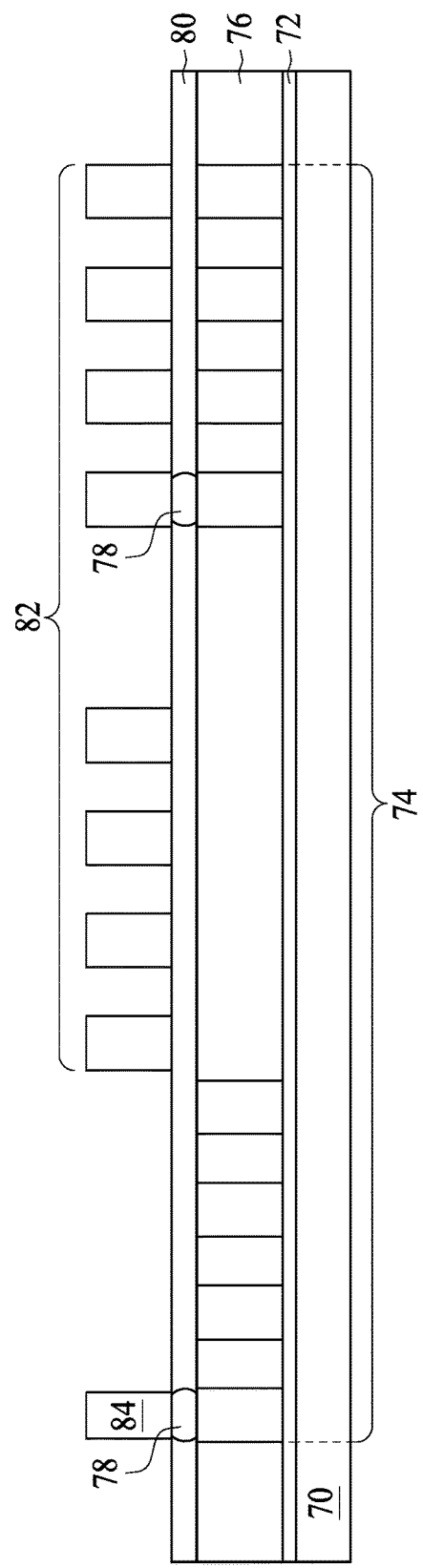

Thereafter, a second spiral coil 82 and a via 84 are placed on the NCF 80 and bonded to the contacts 78 as shown in FIG. 10. The via 84 and an end at the innermost coil turn of the second spiral coil 82 are respectively connected to the contacts 78. Thereafter, a pressure is applied to the second spiral coil 82 and the via 84 by using an elastic pad such as a rubber member while heating by a heater or the like. As a result, the via 84 and the end at the innermost coil turn of the second spiral coil 82 come into contact with the contacts 78 and form conducting paths with the first spiral coil 74. The NCF 80 is present between the contacts 78 and thus no short circuit occurs in applying heat and pressure to the second spiral coil 82 and the via 84. In an alternative embodiment, the cutting tool is not imparted to expose end surfaces of the contacts 78 before placing the second spiral coil 82. When second spiral coil 82 being placed and aligned over the first spiral coil 74 by pressing under an elevated temperature environment, the electrical connections between the second spiral coil 82 and the first spiral coil 74 are formed by extruding the portion of NCF layer between the second spiral coil 82 and the contacts 78 and building up physical contact between the two under the aforesaid condition.

Figure 11A:
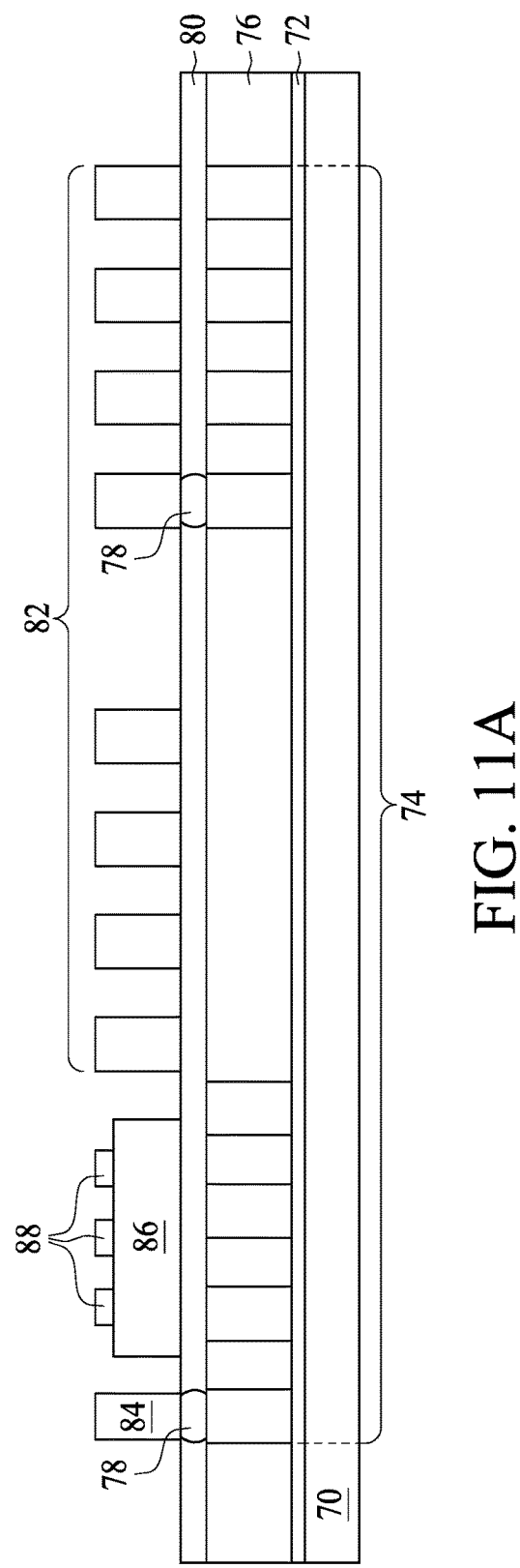
Figure 11B:
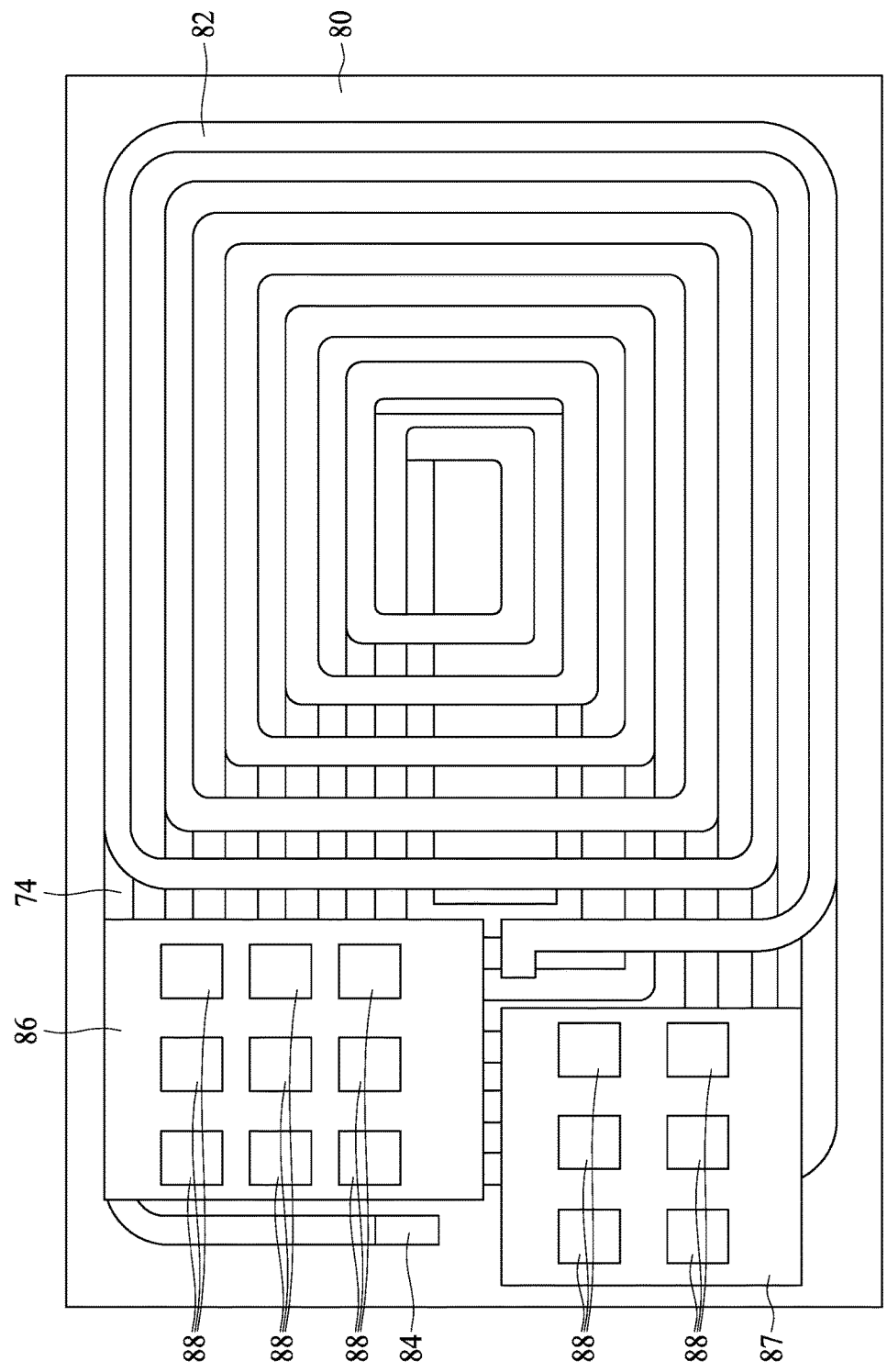

FIG. 11A is a cross-sectional view illustrating the placement of dies 86 and 87 over the first spiral coil 74. Please note that the die 87 is not depicted in FIG. 11A due to the fact that a cutting line taken for the cross-sectional view FIG. 11A is not passing through the die 87. FIG. 11B is a top view perspective of FIG. 11A. As can be seen in FIG. 11B, the dies 86 and 87 are placed over the NCF 80 by the side of the second spiral coil 82. In some embodiments, the die 86 and 87 are attached to the NCF 80, which is adhered to the carrier 70. The die 86 may be a logic device die including logic transistors therein. The die 87 may include IPD such as resistors, capacitors and inductors. In the top view perspective of FIG. 11A, the first spiral coil 74 is depicted as a shaded portion because it is covered by the NCF 80. The second spiral coil 82 partially overlaps with the first spiral coil 74, and both of the two spiral coils 82 and 74 are wound clockwise.

Electrical connectors 88 are formed as the top portions of the die 86 and die 87, and are electrically coupled to the devices in the die 86 and the IPD in the die 87. Details of the electrical connectors 88 are similar to the electrical connectors 26 shown in FIG. 3A and are omitted here for brevity. In some embodiments, dielectric layers are formed at the top surfaces of the die 86 and die 87, with electrical connectors 88 having at least lower portions, or entireties, in the dielectric layer. The top surfaces of the dielectric layers may also be substantially level with the top ends of the electrical connectors 88. When the dielectric layers are not formed, the electrical connectors 88 protrude above the top surfaces of the die 86 and die 87. In this embodiment, the dielectric layers are not depicted in the FIG. 11A and subsequent drawings.

Figure 12:
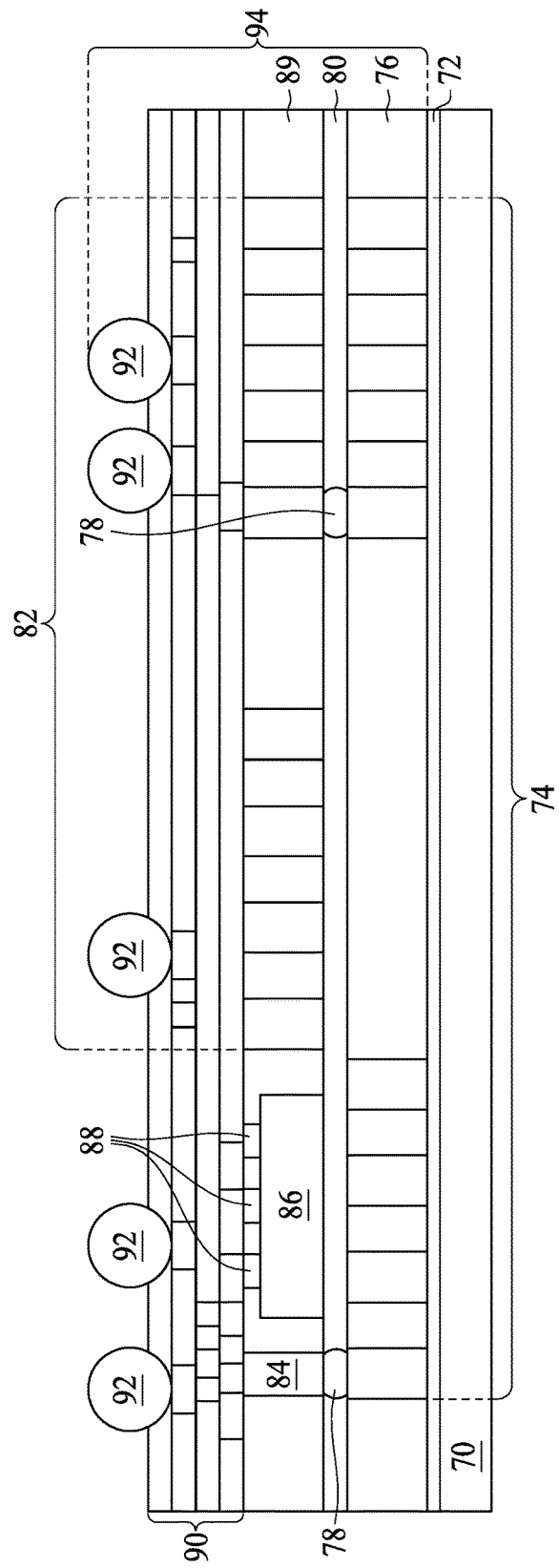

Next, referring to FIG. 12, a molding material 89 is dispensed and molded on the dies 86, 87 and the second spiral coil 82, and then an RDL 90 is formed over the molding material 89. Similar to the RDL 45 of FIG. 6, the RDL 90 also includes dielectric layers and a plurality of connection patterns reside therein, wherein at least a portion of the connection patterns is electrically connected to, and may interconnect, the electrical connectors 88 and the second spiral coil 82. There may be one, two, three, or more dielectric layers, each including a plurality of connection patterns that is at the same level. The connection patterns further include vias that interconnect the connection patterns in neighboring redistribution layers so as to connect the via 84 and the second spiral coil 82 with the die 86 and/or die 87. Further details regarding the RDL 90 are similar to the RDL 45 of FIG. 6 and are omitted here for brevity.

FIG. 12 also illustrates the formation of electrical connectors 92 in accordance with some exemplary embodiments. The formation of the connectors 92 may include placing solder balls on exposed portions of the connection patterns in the RDL 90, and reflowing the solder balls. In alternative embodiments, the formation of the connectors 92 includes performing a plating step to form solder regions over the exposed portions of the connection patterns, and then reflowing the solder regions. The connectors 92 may also include metal pillars, or metal pillars and solder caps, which may also be formed through plating. In some embodiments, the combined structure including the dies 86, 87, the first spiral coil 74, the second spiral coil 82, the via 84, the molding material 79, 89, the NCF 80, the overlying RDL 90 and the connectors 92 is referred to as a fan-out package 94, then the carrier 70 is detached from the package 94 and the adhesive layer 72 may be removed in the subsequent operation. The fan-out package 94 occupies a portion of a wafer that includes a plurality of fan-out packages, and the wafer is dies-sawed along scribe lines into a plurality of fan-out packages.

The exemplary embodiment described above provides a fan-out package including dies and two spiral coils integrated therein. In some embodiments, the dies and spiral coils may form a system for a specified wireless application, for example, an RFID chip or a wireless charging chip. The two partially overlapped spiral coils integrated in the fan-out package in combination possesses a higher inductance comparing to the fan-out package including only one spiral coil disclosed in the previous embodiment. In some embodiments, the upper spiral coil may be connected to and overlap with the lower spiral coil to further increase inductance generated therebetween. In some embodiments, more than two-level spiral coils may be employed and integrated in a fan-out package. In some embodiments, the spiral coils may be wound counter-clockwise. Please note that when multi-level spiral coils are employed, the winding direction of the spiral coils should be in a consistent direction so as to gain an inductance additive effect, and the dies are preferred but not limited to be placed in the highest level. For example, in FIG. 12 the dies 86 and 87 may be disposed in the layer where the coil 82 is located.

The planar spiral coil of the present disclosure possesses a higher inductance per unit area comparing to the existing counterparts prepared by methods that electroplate a coil on a substrate or winding an enameled wire to an inductance coil. The multi-level planar spiral coil integrated in a fan-out package disclosed in the present disclosure further improves the inductance per unit area. The integration of the spiral coils with the associated dies has a low cost and high reliability due to less residual stress induced by the pre-formed spiral coils.

Some embodiments of the present disclosure provide a package structure. The package structure includes a spiral coil, a redistribution layer (RDL) and a molding material. The molding material fills gaps of the spiral coil. The spiral coil is connected to the RDL.

In some embodiments of the present disclosure, a depth-to-width ratio of the spiral coil is greater than about 2.

In some embodiments of the present disclosure, the spiral coil includes copper (Cu).

In some embodiments of the present disclosure, the package structure further includes an upper spiral coil over the spiral coil.

In some embodiments of the present disclosure, the package structure further includes a die connected to the RDL so that the die is connected to the spiral coil through the RDL.

In some embodiments of the present disclosure, the package structure further includes a non-conductive film laid between the upper spiral coil and the spiral coil.

In some embodiments of the present disclosure, the upper spiral coil at least partially overlaps the spiral coil.

In some embodiments of the present disclosure, the upper spiral coil and the spiral coil are wound in a same direction.

In some embodiments of the present disclosure, the upper spiral coil is connected to the spiral coil through a contact.

In some embodiments of the present disclosure, the package structure further includes a die connected to the RDL so that the die is coupled to the upper spiral coil through the RDL.

Some embodiments of the present disclosure provide a fan-out package structure. The fan-out package structure includes a spiral coil, an RDL and a die. The spiral coil has a depth-to-width ratio greater than about 2. The RDL is connected to the spiral coil. The die is coupled to the spiral coil through the RDL.

In some embodiments of the present disclosure, the fan-out package structure further includes a plurality of electrical connectors coupled to the RDL.

In some embodiments of the present disclosure, the electrical connectors include solder balls.

In some embodiments of the present disclosure, the package structure further includes a molding material fills gaps between the spiral coil and the die.

Some embodiments of the present disclosure provide a semiconductor packaging method. The semiconductor packaging method includes: providing a carrier; adhering a spiral coil on the carrier; adhering a die on the carrier; dispensing a molding material on the carrier to fill gaps between the spiral coil and the die; and disposing a redistribution layer (RDL) over the carrier so as to connect the spiral coil with the die.

In some embodiments of the present disclosure, the spiral coil is obtained by means of punching, wet etching or laser-cutting.

In some embodiments of the present disclosure, the adhering of the spiral coil on the carrier comprises vibrating an alignment pallet carrying the spiral coil and mounting the spiral coil onto the carrier.

In some embodiments of the present disclosure, the semiconductor packaging method further includes planarizing the molding material until top ends of the spiral coil and metal pillars of the die are exposed.

In some embodiments of the present disclosure, the semiconductor packaging method further includes disposing a upper spiral coil at least partially overlapping with the spiral coil.

In some embodiments of the present disclosure, the semiconductor packaging method further includes removing the carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor packaging method, comprising:
    providing a carrier;
    adhering a spiral coil on the carrier;
    adhering a die on the carrier;
    dispensing a molding material on the carrier to fill gaps between the spiral coil and the die; and
    disposing a redistribution layer (RDL) over the carrier so as to connect the spiral coil with the die.

2. The semiconductor packaging method of claim 1, wherein the spiral coil is obtained by means of punching, wet etching or laser-cutting.

3. The semiconductor packaging method of claim 1, wherein the adhering of the spiral coil on the carrier comprises vibrating an alignment pallet carrying the spiral coil and mounting the spiral coil onto the carrier.

4. The semiconductor packaging method of claim 1, further comprising planarizing the molding material until top ends of the spiral coil and metal pillars of the die are exposed.

5. A semiconductor packaging method, comprising:
    providing a carrier;
    adhering a first spiral coil including a plurality of coil turns on the carrier;
    dispensing a first molding material on the carrier to fill gaps between the coil turns of the first spiral coil; and
    planarizing the first molding material until top ends of the coil turns of the first spiral coil are exposed.

6. The semiconductor packaging method of claim 5, wherein the adhering of the first spiral coil on the carrier comprises vibrating an alignment pallet carrying the first spiral coil and mounting the first spiral coil onto the carrier.

7. The semiconductor packaging method of claim 5, further comprising forming a contact on the exposed top ends of the coil turns of the first spiral coil.

8. The semiconductor packaging method of claim 7, further comprising attaching a non-conductive film (NCF) to the planarized first molding material.

9. The semiconductor packaging method of claim 8, further comprising disposing a second spiral coil including a plurality of coil turns on the NCF, wherein the second spiral coil is coupled to the first spiral coil through the contact.

10. The semiconductor packaging method of claim 9, further comprising disposing a die of the NCF.

11. The semiconductor packaging method of claim 10, further comprising dispensing a second molding material on the NCF to fill gaps between the coil turns of the second spiral coil and the die.

12. The semiconductor packaging method of claim 11, further comprising planarizing the second molding material until top ends of the coil turns of the second spiral coil and metal pillars of the die are exposed.

13. The semiconductor packaging method of claim 12, further comprising disposing a redistribution layer (RDL) over the carrier so as to couple the second spiral coil with the die.

14. The semiconductor packaging method of claim 13, further comprising disposing a higher spiral coil at least partially overlapping with the spiral coil.

15. The semiconductor packaging method of claim 13, further comprising removing the carrier.

16. A semiconductor packaging method, comprising:
    providing a carrier;
    adhering a spiral coil including a plurality of coil turns on the carrier through an adhesive layer, the coil turns of the spiral coil including a depth-to-width ratio greater than about 2;
    dispensing a molding material on the carrier to fill gaps between the coil turns of the spiral coil.

17. The semiconductor packaging method of claim 16, further comprising planarizing the molding material until top ends of the coil turns of the spiral coil are exposed.

18. The semiconductor packaging method of claim 17, further comprising forming a redistribution layer (RDL) over the carrier.

19. The semiconductor packaging method of claim 18, further comprising forming electrical connectors over the RDL.

20. The semiconductor packaging method of claim 19, further comprising removing the carrier and the adhesive layer.

* * * * *